US008518554B2

(12) United States Patent
Naba et al.

(10) Patent No.: US 8,518,554 B2
(45) Date of Patent: Aug. 27, 2013

(54) CERAMIC METAL COMPOSITE AND SEMICONDUCTOR DEVICE USING THE SAME

(75) Inventors: Takayuki Naba, Kanagawa-ken (JP); Michiyasu Komatsu, Kanagawa-ken (JP); Noritaka Nakayama, Kanagawa-ken (JP); Hiromasa Kato, Kanagawa-ken (JP)

(73) Assignees: Kabushiki Kaisha Toshiba, Tokyo (JP); Toshiba Materials Co., Ltd., Yokohama-shi (JP)

( * ) Notice: Subject to any disclaimer, the term of this patent is extended or adjusted under 35 U.S.C. 154(b) by 428 days.

(21) Appl. No.: 12/307,301

(22) PCT Filed: Jul. 3, 2007

(86) PCT No.: PCT/JP2007/063307
§ 371 (c)(1),
(2), (4) Date: Jan. 2, 2009

(87) PCT Pub. No.: WO2008/004552
PCT Pub. Date: Jan. 10, 2008

(65) Prior Publication Data
US 2009/0283309 A1    Nov. 19, 2009

(30) Foreign Application Priority Data

Jul. 4, 2006   (JP) .................................. 2006-184321

(51) Int. Cl.
*H05K 1/03* (2006.01)
*B32B 15/00* (2006.01)
*B32B 15/04* (2006.01)
*B32B 15/20* (2006.01)

(52) U.S. Cl.
USPC ........... 428/621; 428/627; 428/634; 428/673; 428/674; 428/660

(58) Field of Classification Search
USPC ................. 428/621, 627, 630, 631, 632, 633, 428/634, 646, 647, 648, 655, 668, 669, 670, 428/671, 672, 673, 674, 678, 680, 660, 656
See application file for complete search history.

(56) References Cited

U.S. PATENT DOCUMENTS 6,811,892 B2 * 11/2004 Yeh et al. ...................... 428/647

FOREIGN PATENT DOCUMENTS

JP    1 138087    5/1989
(Continued)

OTHER PUBLICATIONS

Machine Translation, Naba, JP 09-283656, Oct. 1997.*
(Continued)

*Primary Examiner* — Michael La Villa
(74) *Attorney, Agent, or Firm* — Oblon, Spivak, McClelland, Maier & Neustadt, L.L.P.

(57) ABSTRACT

A ceramic-metal composite includes a ceramic substrate, an active metal brazing alloy layer, and a metal plate bonded to the ceramic substrate through the active metal brazing alloy layer disposed therebetween. The active metal brazing alloy layer contains a transition metal that is at least one element selected from Group-8 elements specified in the periodic table. According to the above configuration, the following composite and device can be provided: the ceramic-metal composite that exhibits high bonding strength, heat cycle resistance, durability, and reliability even if the ceramic-metal composite is used in a power module and a semiconductor device including the ceramic-metal composite.

7 Claims, 1 Drawing Sheet

(56) References Cited

FOREIGN PATENT DOCUMENTS

| | | |
|---|---|---|
| JP | 4 270094 | 9/1992 |
| JP | 9-153647 | 6/1997 |
| JP | 9 283656 | 10/1997 |

OTHER PUBLICATIONS

Translation, Shimizu et al., JP 04-270094, Sep. 1992.*
Japanese Office Action issued Nov. 20, 2012, in Japan Patent Application No. 2008-523690.

* cited by examiner

CERAMIC METAL COMPOSITE AND SEMICONDUCTOR DEVICE USING THE SAME

CROSS-REFERENCE TO PRIORITY APPLICATIONS

The present application is based on PCT/JP2007/063307 filed on Jul. 3, 2007 and claims priority to JP2006-184321 filed on Jul. 4, 2006, the entire contents of each of which are hereby incorporated herein by reference.

TECHNICAL FIELD

The present invention relates to ceramic-metal composites for use in power modules, methods for manufacturing the ceramic-metal composites, and semiconductor devices including the ceramic-metal composites. The present invention particularly relates to a ceramic-metal composite which has a junction (bonded portion) between a ceramic substrate and a metal circuit plate which can exhibit high bondability (bonding property) and high heat cycle resistance when being used as a ceramic circuit board, a method for manufacturing the ceramic-metal composite, and a semiconductor device including the ceramic-metal composite.

BACKGROUND ART

In recent years, ceramic-metal composites have been widely used as circuit boards such as substrates for power transistor module substrates and substrates for switching power supply modules. The ceramic-metal composites include ceramic substrates and metal plates, such as copper plates, bonded to the substrates. Commonly, examples of the ceramic substrates include aluminum nitride substrates and silicon nitride substrates which have electrically insulating property and a high thermal conductivity.

A conventional ceramic-metal composite such as a ceramic circuit board for power modules is manufactured in such a manner that a ceramic substrate made of aluminum nitride (AlN), which has high thermal conductivity, or silicon nitride ($Si_3N_4$), which has high strength and thermal conductivity, is bonded to a metal plate, such as a copper plate, having high thermal conductivity by a process such as a refractory metal process using Mo or W, a DBC process making use of the eutectic reaction between copper and oxygen, or an active metal process and a metal portion is then patterned through an etching treatment.

In particular, a ceramic-metal composite (ceramic circuit board) 11 having a circuit formed by etching a copper plate as described above includes a ceramic substrate 12, a metal circuit plate 13 which is a copper plate and which is bonded to a surface of the ceramic substrate 12, and a backing metal plate 14 which is a copper plate and which is bonded to another surface of the ceramic substrate 12 as shown in FIGS. 1 to 3. Examples of a process for bonding a metal plate to the ceramic substrate 12 include such a direct bonding process, refractory metal metallizing process, and active metal process as described below.

The direct bonding process is a so-called direct bonding copper process (DBC process) in which a copper plate is directly bonded to the ceramic substrate 2 using a eutectic liquid phase such as a $Cu$—$Cu_2O$ phase. The refractory metal metallizing process is a process in which a refractory metal such as Mo or W is fixed on the ceramic substrate by firing. Further, the active metal process is a process in which a metal plate is bonded to the ceramic substrate 12 through a brazing alloy layer 15 disposed therebetween. The active metal process is widely and generally used in such a way that a brazing paste, which is obtained by adding an active metal such as Ti to a eutectic brazing alloy with a Cu—Ag eutectic composition (72% Ag and 28% Cu on a weight basis), is applied between a ceramic substrate and a metal member and then heat-treated at an appropriate temperature such that the ceramic substrate and the metal member are bonded to each other, because high strength and high sealing performance can be achieved.

An example of a bonding structure prepared by bonding the ceramic substrate and the metal member together is a structure including a metal circuit plate and a brazing alloy layer extending over a portion of a side surface of the metal circuit plate as disclosed in Patent Document 1. This bonding structure is effective in achieving high bonding strength and therefore is capable of achieving high reliability against thermal cycles (heat cycles).

Patent Document 2 discloses another bonding structure in which the area of the interface between a metal circuit plate and a ceramic substrate is less than the area of the front surface thereof and the area of a brazing alloy layer containing an active metal is greater than the area of a bonding surface of the metal circuit plate. According to this bonding structure, a bonding surface of the metal circuit plate is fixed on the brazing alloy layer but the front surface thereof is not particularly restricted and is therefore expandable depending on the difference in coefficient of linear expansion therebetween. This allows the residual stress to be reduced, thereby enhancing the heat cycle resistance.

Examples of a known process for forming a circuit include a process using a copper plate patterned by pressing work or etching treatment, a process for patterning a bonded metal portion by etching or another technique, and a similar process. A ceramic circuit board prepared by the DBC process or an active metal brazing process has a simple structure, a small heat resistance, and an advantage in that the ceramic circuit board can cope with high-current (high-power use) or high-integration semiconductor chips.

Patent Document 1: Japanese Unexamined Patent Application Publication No. 5-347469
Patent Document 2: Japanese Unexamined Patent Application Publication No. 6-263554

In recent years, high-integration semiconductor elements and high-power semiconductor devices including ceramic-metal composites used as circuit boards have rapidly spread. Thermal stresses or thermal loads repeatedly applied to the ceramic-metal composites are likely to be increasing; hence, the ceramic-metal composites need to have sufficient bonding strength and resistance to the thermal stresses and thermal cycles. The ceramic-metal composites need to have high definition circuit patterns (extremely fine circuit patterns) because such high-integration semiconductor elements are mounted on the ceramic-metal composites. The ceramic-metal composites, which may be used as ceramic circuit boards, need to have bonding portions that have high bondability (voidless bonding) so as not to contain any voids and further need to have high heat durability and high heat cycle resistance.

However, conventional ceramic-metal bonding techniques have a disadvantage in that bondability varies significantly due to changes in bonding atmospheres during large-scale manufacture (mass-production) or depending on the lot of substrates. Even if high bondability is achieved, requirements for heat cycle resistance have not been sufficiently satisfied. Therefore, there has been posed a problem in that semiconductor devices including ceramic-metal composites used as circuit boards have low reliability or are low in production yield.

Furthermore, there has been posed also a problem in that conventional ceramic-metal composites are liable to lower an operating reliability because molten brazing alloys excessively spread widely over surfaces of the conventional ceramic-metal composites thereby to cause short circuit accidents between adjacent metal circuit plates.

DISCLOSURE OF INVENTION

The present invention have been achieved for solving the above problems. It is an object of the present invention to provide a ceramic-metal composite which has high bonding strength, heat cycle resistance, durability, and reliability when the ceramic-metal composite is used for a power module; to provide a method for manufacturing the ceramic-metal composite; and to provide a semiconductor device including the ceramic-metal composite.

In order to achieve the above object, the inventors of the present invention have investigated components of brazing alloy layers effective in enhancing both the bonding strength between ceramic substrates and metal circuit plates and the heat cycle resistance of composites and have then evaluated influences of the components on the bonding strength and the heat cycle resistance.

As a result, the inventors have found that the use of a brazing alloy layer containing a transition metal, such as cobalt, belonging to Group 8 elements is effective in greatly enhancing both the bonding strength and the heat cycle resistance of a metal circuit plate used as a ceramic substrate and is effective in achieving a ceramic-metal composite which hardly cause cracks and which has high durability.

The present invention has been achieved on the basis of the above findings. A ceramic-metal composite according to the present invention includes a ceramic substrate, an active metal brazing alloy layer, and a metal plate bonded to the ceramic substrate through the active metal brazing alloy layer disposed therebetween. The active metal brazing alloy layer contains a transition metal that is at least one element selected from Group-8 elements specified in the long-form periodic table.

The ceramic substrate, which is included in the ceramic-metal composite, is not particularly limited and may be made of a nitride ceramic such as silicon nitride ($Si_3N_4$) or aluminum nitride (AlN), an oxide ceramic such as aluminum oxide ($Al_2O_3$) or zirconium oxide ($ZrO_2$), a carbide ceramic such as silicon carbide (SiC), or a non-oxide ceramic such as a boride including lanthanum boride. Since the metal plate is bonded to the ceramic substrate by an active metal process, a non-oxide ceramic such as aluminum nitride or silicon nitride is particularly preferred. The ceramic substrate may contain a sintering aid such as yttrium.

In order to increase the heat dissipation efficiency (heat radiating property) of the ceramic-metal composite, a silicon nitride substrate with a thermal conductivity of 60 W/mK or more or an aluminum nitride substrate with a thermal conductivity of 200 W/mK or more is preferably used.

Examples of a metal material for forming the metal plate such as a metal circuit plate or a backing metal plate include, but are not limited to, metals such as copper, aluminum, iron, nickel, chromium, silver, molybdenum, and cobalt; alloys of these metals; and other metal material suitable for the active metal process. In view of conductivity and raw material cost, copper, aluminum, or a copper or aluminum alloy is preferably used and Kovar or the like is particularly preferably used.

The thickness of the metal circuit plate is determined in consideration of the current-carrying capacity thereof. When the ceramic substrate has a thickness of 0.25 to 1.2 mm and the metal circuit plate has a thickness of 0.1 to 0.5 mm, the combination of the ceramic substrate and the metal circuit plate is effective in preventing distortion due to a difference in thermal expansion coefficient therebetween.

In the ceramic-metal composite according to the present invention, the active metal brazing alloy layer, which is used to bond the metal circuit plate to the ceramic substrate, is made of an Ag—Cu brazing alloy which contains an active metal that is at least one selected from the group consisting of Ti, Zr, Hf, Al, and Nb and which has an appropriate composition ratio or another alloy.

A material for forming the active metal brazing alloy layer is preferably used in the form of paste. The active metal brazing alloy layer is formed in such a manner that a bonding composition paste (brazing material) prepared by dispersing a brazing alloy composition and a binder in an organic solvent is applied and coated onto the ceramic substrate by a screen printing method or in another manner. The mass ratio of components in the bonding composition paste is such that the sum of the contents of metal components (including carbon particles) is 100% by mass. That is, organic components such as the binder, which acts as a binding material, and the solvent, which acts as a dispersion medium, are excluded from calculation.

A performed example of the bonding composition paste is as follows: a bonding composition paste prepared by dispersing a composition below in an organic solvent. This composition contains 15% to 35% Cu and 5% or less of an active metal that is at least one selected from the group consisting of Ti, Zr, Hf, Al, and Nb on a mass basis, the remainder being substantially Ag. This composition is close to an Ag—Cu eutectic composition and has good low-temperature bondability and stability.

The active metal is a component for enhancing the wettability of the brazing alloy to the ceramic substrate and is particularly effective in enhancing the wettability thereof with respect to an aluminum nitride (AlN) substrate. The content of the active metal in the bonding composition is preferably 5% by mass or less. The content of the active metal, such as Ti, in the brazing alloy layer is more preferably 0.1% to 2% by mass.

The active metal brazing alloy layer, which is disposed in the ceramic-metal composite according to the present invention, contains a predetermined amount of the transition metal, which is at least one element selected from Group-8 elements specified in the long-form periodic table. Since the active metal brazing alloy layer contains a predetermined amount of the Group-8 transition metal, the transition metal segregates in a side of the metal plate because of the high reactivity of the transition metal with a component of the metal plate; hence, a reaction product reducing the wettability (bondability) of the brazing alloy layer to the metal plate is prevented from being excessively produced. This allows the brazing alloy layer and the metal plate to be maintained in good bonding condition.

In addition, a segregation layer of the transition metal restricts the width of a portion wet with a component of the molten brazing alloy; hence, the brazing alloy can be prevented from excessively expanding, adjacent metal circuit plates can be prevented from being short-circuited, the bonding strength between the ceramic substrate and the metal plate can be significantly enhanced, and the ceramic-metal composite can be enhanced in heat cycle resistance and durability.

When, for example, an Ag—Cu—Sn—Ti—C type brazing alloy layer contains a trace amount of Co, Co segregates in a side of the copper plate because of the high reactivity of Co with the copper plate (Cu); hence, a Cu—Sn alloy which is a product formed by the reaction of Cu in the Cu plate with Sn contained in this brazing alloy layer and which reduces the wettability (bondability) with respect to the copper plate is prevented from being excessively produced. This allows the copper plate and this brazing alloy layer to be maintained in good bonding condition. In addition, a segregation layer of Co restricts the width of a portion wet with an Ag—Cu—Sn component in the molten brazing alloy; hence, the brazing alloy can be prevented from excessively expanding and the metal circuits can be effectively prevented from being short-circuited.

The content of the Group-8 transition metal in the active metal brazing alloy layer is preferably 0.02% to 0.5% by mass. When the content of the Group-8 transition metal is less than 0.02% by mass, the segregation effect of the transition metal is low and therefore an improvement in the bonding strength between the ceramic substrate and the metal plate is small.

On the other hand, when the content of the Group-8 transition metal is greater than 0.5% by mass, the brazing alloy disadvantageously has a high melting point because the transition metal is refractory. This requires an increase in heating temperature during the bonding operation, thereby to cause a significant thermal influence on the composite.

Therefore, the content of the Group-8 transition metal in the active metal brazing alloy layer is limited within the range of 0.02% to 0.5% by mass and more preferably 0.05% to 0.15% by mass.

Furthermore, the present invention also provides a method for manufacturing the ceramic-metal composite. The manufacturing method includes applying an active metal brazing alloy containing a transition metal that is at least one element selected from Group-8 elements onto at least one of the ceramic substrate and the metal plate, and bonding the metal plate to the ceramic substrate in such a manner that the metal plate is provided on the ceramic substrate and the ceramic substrate and the metal plate are heated together.

The heating temperature of the ceramic substrate and metal plate to be bonded together is preferably 700° C. to 900° C. When the heating temperature thereof is lower than 700° C., the brazing alloy is insufficiently melted and therefore it is difficult to uniformly form the active metal brazing alloy layer. On the other hand, when the heating temperature thereof is higher than 900° C., the composite suffers from significant thermal influence, which is not preferable.

In the ceramic-metal composite and the method of manufacturing the composite, the Group-8 transition metal is preferably cobalt (Co) or palladium (Pd). When the Group-8 transition metal of cobalt (Co) or palladium (Pd) is contained, the effect of segregating the element at the metal plate side of the metal brazing alloy layer is high and a reaction product reducing the wettability (bondability) with respect to the metal plate is effectively prevented from being produced.

In the ceramic-metal composite and the method of manufacturing the composite, the metal plate is preferably a copper plate (Cu plate). A metal circuit plate prepared from the copper plate has high current-carrying capacity and high bondability with respect to the active metal brazing alloy layer.

In the ceramic-metal composite and the method of manufacturing the composite, cobalt or palladium is preferably dispersed in the copper plate. When cobalt or palladium is preferably dispersed in the copper plate, which serves as a metal circuit plate, the wettability of the copper plate with respect to the brazing alloy material can be enhanced and therefore the bonding strength of the copper plate can be increased.

In the ceramic-metal composite and the method of manufacturing the composite, the active metal brazing material layer preferably contains Ag, Cu, and Ti. In particular, the composition ratio of Ag to Cu is preferably close to a eutectic composition (72% Ag and 28% Cu on a mass basis). When the composition ratio is close to such a eutectic composition, the brazing alloy has a low liquidus temperature (melting point) and is readily melted and therefore the bonding temperature can be reduced and lowered. This can reduce the thermal influence on the composite.

When the brazing alloy material contains an active metal such as Ti, the bonding strength between the ceramic substrate and the brazing alloy layer can be greatly increased. The content of Ti in the brazing alloy material is preferably 5% by mass or less and more preferably 0.1% to 2% by mass.

In the ceramic-metal composite and the method of manufacturing the composite, the active metal brazing alloy layer preferably contains at least one of tin (Sn) and indium (In). Sn and In have an effect of reducing the melting point of the brazing alloy. Therefore, the bonding temperature of the ceramic substrate and the metal plate can be reduced and lowered. This can reduce the thermal influence on the resultant composite. The content of at least one of Sn and In in the brazing alloy layer is preferably set to a range from 5% to 15% by mass.

In the ceramic-metal composite and the method of manufacturing the composite, the active metal brazing alloy layer preferably contains carbon. The carbon contained in the brazing alloy layer has a function of adjusting the coefficient of linear expansion of the brazing alloy layer. In particular, the coefficient of linear expansion of the brazing alloy layer can be adjusted to an intermediate value between the coefficient of linear expansion of the ceramic substrate and that of the metal plate; hence, the difference in thermal expansion coefficients between members of the composite can be reduced. This allows the heat cycle resistance of the composite to be enhanced.

The carbon contained therein is preferably particulate matter and preferably has an average particle size of 2 µm or less and more preferably 1 µm or less. The content of carbon in the brazing alloy layer is preferably 0.1% to 2% by mass. When the carbon content is less than 0.1% by mass, the effect of adjusting the coefficient of linear expansion of the brazing alloy layer is insufficient. On the other hand when the carbon content is greater than 2% by mass, the coefficient adjusting effect is saturated.

The ceramic-metal composite according to the present invention is manufactured by, for example, the following procedures described below. The ceramic substrate and the metal plate are prepared. The bonding composition paste (brazing alloy material paste) is applied onto the ceramic substrate. In this operation, even if the brazing alloy paste is applied onto the ceramic substrate such that a layer of the brazing alloy paste has an area slightly greater than that of the metal plates such as a metal circuit plate or a backing metal plate, the brazing alloy paste does not flow out of the ceramic substrate. The thickness of the brazing alloy paste layer depends on the thickness of the metal plate, and is preferably set to, for example, about 20 to 50 µm.

Then, the brazing alloy paste layer is dried in such a manner that the metal plate and the like are pressed against the brazing alloy paste layer. The resulting brazing alloy paste layer is heat-treated at the bonding temperature of the brazing alloy material in an inert atmosphere such as a vacuum or a nitrogen atmosphere, whereby the ceramic substrate and the metal plate are bonded to each other. The composite is then subjected to an etching treatment, whereby the ceramic-metal composite, which has a predetermined metal circuit pattern, is manufactured.

A semiconductor device according to the present invention comprises the ceramic-metal composite as a ceramic circuit board.

According to the ceramic-metal composite and the method of manufacturing the composite of the present invention, the active metal brazing alloy layer contains a predetermined amount of the transition metal, which is at least one element selected from Group-8 elements specified in the periodic table. The transition metal segregates in the metal plate side during the heat bonding operation because of the high reactivity of the transition metal with a component of the metal plate; hence, the reaction product, which reduces the wettability (bondability) of the brazing alloy layer with respect to the metal plate, is prevented from being excessively produced. This allows the brazing alloy layer and the metal plate to be maintained in good bonding condition.

In addition, the segregated metal layer of the transition metal restricts the width of a portion wet with a component of the molten brazing alloy; hence, the brazing alloy can be prevented from excessively expanding, the metal circuit plate can be prevented from being short-circuited, the bonding strength between the ceramic substrate and the metal plate can be significantly enhanced, and the ceramic-metal composite can be enhanced in heat cycle resistance and durability.

Accordingly, the use of the ceramic-metal composite as a circuit board allows semiconductor devices which hardly crack and which have high durability and reliability to be manufactured with a high production yield in a large scale.

BEST MODES FOR CARRYING OUT THE INVENTION

Embodiments of the present invention will now be described in detail with reference to the accompanying drawings.

EXAMPLES 1 TO 28

A number of the following ceramic substrates 12 were prepared: silicon nitride ($Si_3N_4$) substrates having a three-point bending strength of 600 MPa and a flexure of 1.60 mm, aluminum nitride (AlN) substrates having a three-point bending strength of 300 MPa and a flexure of 0.5 mm, and aluminum oxide ($Al_2O_3$) substrates having a three-point bending strength of 400 MPa and a flexure of 1.20 mm. These ceramic substrates had the same shape and thickness as those of a ceramic substrate 12 shown in FIGS. 1 to 3.

Figure 1:
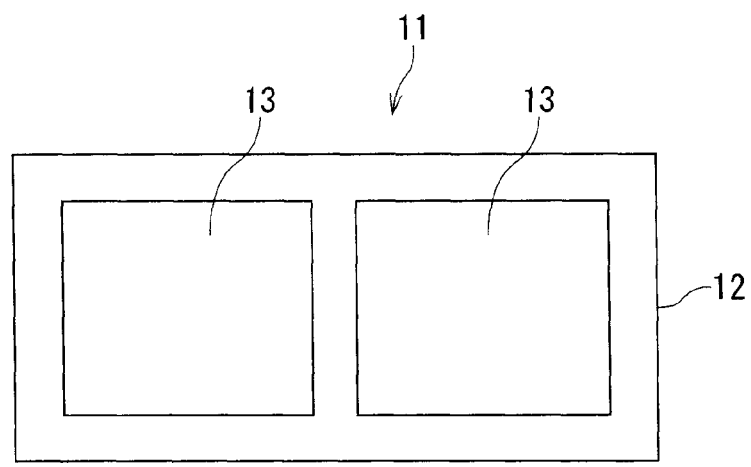
FIG. 1 is a plan view of a ceramic-metal composite according to an embodiment of the present invention.
Figure 2:
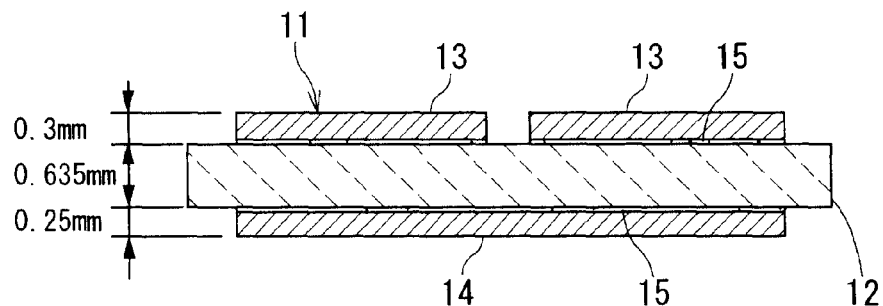
FIG. 2 is a sectional view of the ceramic-metal composite shown in FIG. 1.
Figure 3:
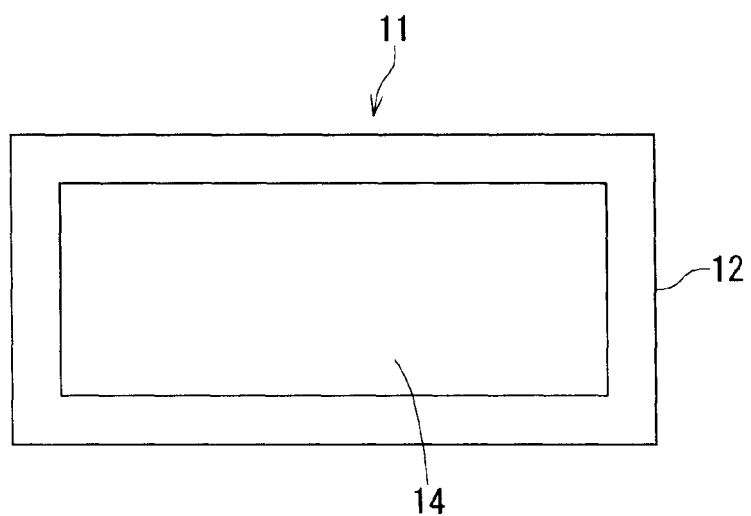
FIG. 3 is a bottom view of the ceramic-metal composite shown in FIG. 1.

On the other hand, the following plates were prepared from Cu (oxygen-free copper) so as to have a thickness and shape shown in FIGS. 1 to 3: metal circuit plates 13 (a thickness of 0.3 mm) and backing metal plates (a thickness of 0.25 mm) 14.

On the other hand, powder mixtures containing the following powders at mass ratios shown in Tables 1 and 2 were prepared: active metal powders such as an Ag powder, a Cu powder, an Sn powder, an In powder, a Ti powder, and a Zr powder; a C powder; and a transition metal powder such as a Co powder or a Pd powder. A binder solution was prepared by dissolving ethyl cellulose, which was used as a binder, in terpineol, which was used as a solvent. Pasty bonding compositions were each prepared in such a manner that 20 parts by weight of the above binder solution was added to 100 parts by weight of one of the powder mixtures and the binder solution and the powder mixture were mixed in a grinder and then kneaded by means of three-high rolls. The C powder having an average particle size of 0.7 μm was used.

The pasty bonding compositions, which contained the components shown in Tables 1 and 2, were applied to both surfaces of each of the silicon nitride ($Si_3N_4$) substrates, the aluminum nitride (AlN) substrates, and the aluminum oxide ($Al_2O_3$) by a screen-printing so as to form coated layers each having a thickness of 30 μm.

At this operation, the pasty bonding compositions were applied thereto such that metal circuit patterns to be finally formed had no insulation problem. In particular, the pasty bonding compositions were applied thereto such that the layers extended from side surfaces of the metal circuit patterns by about 0.02 to 0.1 mm and had an area slightly greater than that of the metal circuit patterns.

The metal circuit plates and the backing metal plates were provided on the ceramic substrates with the paste is sandwiched therebetween, whereby laminated bodies having a three-layer structure were prepared. The laminated bodies were each placed in a furnace, the furnace was evacuated to a pressure (vacuum degree) of $1 \times 10^{-4}$ Torr, and the laminated bodies were then heated at bonding temperatures shown in Tables 1 and 2 for 20 minutes such that the metal circuit plates 13 and the backing metal plates 14 were bonded to the ceramic substrates 12 through active metal brazing alloy layers 15 disposed therebetween as shown in FIGS. 1 to 3, whereby a plurality of ceramic-metal joint bodies (bonded bodies) were obtained. The joint bodies were subjected to etching treatment with ferric chloride, whereby ceramic-metal composites 11, having predetermined metal circuit patterns 13 and 13, according to Examples 1 to 28 were prepared.

COMPARATIVE EXAMPLES 1 TO 6

Brazing alloy pastes were subjected to coating treatment by printing using brazing alloy compositions shown in Tables 1 and 2 under substantially the same conditions as those used in Examples 1 to 28 except that active metal brazing alloy layers contained no Co nor Pd, which was a Group-8 transition metal. The brazing alloy pastes were subjected to heat bonding operation at predetermined bonding temperatures T and then subjected to the etching treatment, whereby ceramic-metal composites according to Comparative Examples 1 to 6 were prepared.

With respect to the ceramic-metal composites, prepared as described above, according to the examples and the comparative examples, junctions between the ceramic substrates and metal circuit plates 13 bonded to each other were measured for calculating unbonded ratio (void ratio). The ceramic-metal composites were subjected to a heat cycle test (thermal shock test), whereby the ceramic-metal composites were evaluated for heat cycle resistance.

The unbonded ratio (void ratio) was determined in such a manner that an image of an unbonded portion of each composite was taken by means of an ultrasonic device and the area percentage of the unbonded portion was determined by analyzing the image.

In the heat cycle test, the composite was maintained at −40° C. for 30 minutes, maintained at room temperature (RT: 25° C.) for ten minutes, maintained at 125° C. for 30 minutes, and then maintained at room temperature for ten minutes in a cycle and this cycle was repeated 300 times.

The healthy rate (soundness ratio) η (%) was calculated from the length of a crack caused by the 300-cycle thermal shock test, whereby results shown in Tables 1 and 2 were obtained.

The healthy rate η (%) is an index defined by the equation η (%)=(Lo−L)/Lo×100, wherein Lo represents the circumference of a metal plate disposed on a ceramic substrate in which a fine crack may be formed by a heat cycle test (TCT) and L represents the total length of the fine cracks. Therefore, a healthy rate η of 100% shows a sound state in which no fine crack is present. The length of the fine crack increases with a reduction in healthy rate η, which shows an unsound state. A healthy rate η of 0% shows that a substrate entirely cracks.

TABLE 1

| Sample No. | Ceramic Substrates | Ag | Cu | Sn | In | Ti | C | Transition Metals: Co | Bonding Temperature T (° C.) | Void Ratio (unbonded ratio) (%) | Healthy Ratio η (%) after Heat Cycle Test |
|---|---|---|---|---|---|---|---|---|---|---|---|
| Example 1 | Silicon Nitride | 69 | 26.9 | — | — | 4 | — | 0.1 | 840 | 10 | 100 |
| Example 2 | Silicon Nitride | 61.8 | 24.1 | 10 | — | 4 | — | 0.1 | 790 | 0 | 100 |
| Example 3 | Silicon Nitride | 61.1 | 23.8 | 10 | — | 4 | 1 | 0.1 | 800 | 0 | 100 |
| Example 4 | Silicon Nitride | 61.1 | 23.8 | — | 10 | 4 | 1 | 0.1 | 800 | 0 | 100 |
| Example 5 | Silicon Nitride | 47.4 | 47.5 | — | — | 4 | 1 | 0.1 | 850 | 2 | 100 |
| Example 6 | Alminum Nitride | 61.8 | 24.1 | 10 | — | 4 | — | 0.1 | 790 | 0 | 96 |
| Example 7 | Alminum Nitride | 61.1 | 23.8 | 10 | — | 4 | 1 | 0.1 | 800 | 0 | 98 |
| Example 8 | Silicon Nitride | 69 | 26.97 | — | — | 4 | — | 0.03 | 830 | 0 | 100 |
| Example 9 | Silicon Nitride | 61.3 | 24.1 | 10 | — | 3.4 | 1 | 0.2 | 790 | 0 | 100 |
| Example 10 | Silicon Nitride | 61.8 | 24.1 | 5 | 5 | 4 | — | 0.1 | 770 | 0 | 100 |
| Example 11 | Alminum Nitride | 63.8 | 25.1 | 9 | — | 2 | — | 0.1 | 780 | 0 | 97 |
| Example 12 | Alminum Nitride | 57.6 | 24.84 | — | 11 | 5.4 | 1 | 0.2 | 800 | 0 | 98 |
| Example 13 | Alminum Nitride | 62.4 | 25.1 | 10 | — | 2 | — | 0.5 | 790 | 0 | 98 |
| Example 14 | Alminum Nitride | 69 | 26.9 | — | — | 4 | — | 0.1 | 840 | 0 | 91 |
| Comparative Example 1 | Silicon Nitride | 69.1 | 26.9 | — | — | 4 | — | — | 830 | 22 | 93 |
| Comparative Example 2 | Silicon Nitride | 61.9 | 24.1 | 10 | — | 4 | — | — | 780 | 17 | 90 |
| Comparative Example 3 | Silicon Nitride | 61.2 | 23.8 | 10 | — | 4 | 1 | — | 800 | 20 | 96 |
| Comparative Example 4 | Alminum Nitride | 61.9 | 24.1 | 10 | — | 4 | — | — | 790 | 21 | 34 |

TABLE 2

| Sample No. | Ceramic Substrates | Ag | Cu | Sn | In | Active Metals | C | Transition Metals | Bonding Temperature | Void Ration (unbonded ration) (%) | Healthy Ratio η (%) after Heat Cycle Test |
|---|---|---|---|---|---|---|---|---|---|---|---|
| Example 15 | Silicon Nitride | 69.0 | 26.9 | — | — | Zr(4) | — | Pd(0.1) | 850 | 15 | 100 |
| Example 16 | Silicon Nitride | 61.8 | 24.1 | 10 | — | Zr(4) | — | Pd(0.1) | 800 | 5 | 100 |
| Example 17 | Silicon Nitride | 61.1 | 23.8 | 10 | — | Zr(4) | 1 | Pd(0.1) | 810 | 10 | 100 |
| Example 18 | Alminum Nitride | 61.8 | 24.1 | 10 | — | Zr(4) | — | Pd(0.1) | 795 | 5 | 91 |
| Example 19 | Silicon Nitride | 69.0 | 26.9 | — | — | Zr(4) | — | Co(0.1) | 840 | 12 | 98 |
| Example 20 | Silicon Nitride | 61.8 | 24.1 | 10 | — | Zr(4) | — | Co(0.1) | 790 | 4 | 100 |
| Example 21 | Silicon Nitride | 61.1 | 23.8 | 10 | — | Zr(4) | 1 | Co(0.1) | 800 | 2 | 100 |
| Example 22 | Silicon Nitride | 61.1 | 23.8 | — | 10 | Zr(4) | 1 | Co(0.1) | 800 | 2 | 100 |
| Example 23 | Silicon Nitride | 47.4 | 47.5 | — | — | Zr(4) | 1 | Co(0.1) | 850 | 5 | 98 |
| Example 24 | Alminum Nitride | 61.8 | 24.1 | 10 | — | Zr(4) | — | Co(0.1) | 790 | 2 | 100 |
| Example 25 | Silicon Nitride | 70.0 | 26.9 | — | — | Ti(3) | — | Pd(0.1) | 850 | 10 | 100 |
| Example 26 | Silicon Nitride | 62.8 | 24.1 | 10 | — | Ti(3) | — | Pd(0.1) | 800 | 3 | 100 |
| Example 27 | Silicon Nitride | 62.1 | 23.8 | 10 | — | Ti(3) | 1 | Pd(0.1) | 810 | 7 | 100 |
| Example 28 | Alminum Nitride | 62.8 | 24.1 | 10 | — | Ti(3) | — | Pd(0.1) | 795 | 3 | 95 |
| Comparative Example 5 | Silicon Nitride | 47.5 | 47.5 | — | — | Zr(4) | 1 | — | 860 | 10 | 91 |
| Comparative Example 6 | Alminum Nitride | 61.9 | 24.1 | 10 | — | Zr(4) | — | — | 795 | 15 | 88 |

In order to evaluate the ceramic-metal composites of the examples and the comparative examples, the metal circuit plates subjected or unsubjected to the thermal cycle test were measured for bonding strength (peeling strength). Furthermore, the metal circuit plates, that is, copper plates were observed with an EPMA whether Co or Pd diffused in the copper plates. The metal circuit plates (front patterns), which were bonded to the front surfaces of the substrates, were checked whether short circuits (shorts) were present or not, whereby results shown in Table 3 were obtained.

TABLE 3

| Sample No. | Bonding Strengh Before Heat Cycle Test (kN/m) | Bonding Strengh After Heat Cycle Test (kN/m) | Diffusion of Group-8 Element such as Co in Copper plate | Short Circuit in front Copper Plate Patterns |
|---|---|---|---|---|
| Example 1 | 11.2 | 10.4 | Observed | Not present |
| Example 2 | 15.7 | 15.3 | Observed | Not present |
| Example 3 | 16.3 | 16.2 | Observed | Not present |
| Example 4 | 17.1 | 16.3 | Observed | Not present |
| Example 5 | 10.6 | 10.1 | Observed | Not present |
| Example 6 | 15.6 | 14.9 | Observed | Not present |
| Example 7 | 16.6 | 16.3 | Observed | Not present |
| Example 8 | 13.5 | 13.2 | Observed | Not present |
| Example 9 | 16.0 | 16.1 | Observed | Not present |
| Example 10 | 17.2 | 16.8 | Observed | Not present |
| Example 11 | 15.3 | 14.7 | Observed | Not present |
| Example 12 | 16.3 | 15.0 | Observed | Not present |
| Example 13 | 14.9 | 14.1 | Observed | Not present |
| Example 14 | 10.8 | 9.9 | Observed | Not present |
| Example 15 | 10.2 | 9.9 | Observed | Not present |
| Example 16 | 13.9 | 13.2 | Observed | Not present |
| Example 17 | 16.3 | 15.3 | Observed | Not present |
| Example 18 | 13.3 | 12.0 | Observed | Not present |
| Comparative Example 1 | 8.9 | 7.9 | Not observed | Not present |
| Comparative Example 2 | 13.8 | 13.2 | Not observed | Present |
| Comparative Example 3 | 15.9 | 15.3 | Not observed | Present |
| Comparative Example 4 | 13.3 | 8.0 | Not observed | Present |
| Comparative Example 5 | 7.9 | 6.9 | Not observed | Present |
| Comparative Example 6 | 13.8 | 12.2 | Not observed | Present |

As is clear from the results shown in Tables 1 and 2, in the ceramic-metal composites, including the active metal brazing alloy layers containing a predetermined amount of a transition metal component such as Co or Pd, according to the examples, the junctions between the ceramic substrates and the metal plates (circuit patterns) had a small unbonded ratio (void ratio) and were in good bonding condition. It was confirmed that these ceramic-metal composites had good bondability and high heat cycle resistance.

On the other hand, some of the ceramic-metal composites, including the active metal brazing alloy layers containing no transition metal component such as Co or Pd, according to Comparative Examples 1 to 6 were good in healthy rate η after being subjected to the heat cycle test. However, in general, most of these ceramic-metal composites had a large unbonded ratio (void ratio) and therefore were not in good bonding condition.

As is clear from the results shown in Table 3, the metal circuit plates of these ceramic-metal composites subjected or unsubjected to the thermal cycle test had a tendency of exhibiting a low bonding strength. Therefore, it was confirmed that these ceramic-metal composites had low durability.

The composites, subjected to the 300-cycled heat cycle test, according to the examples had a small number of cracks, gaps, or stripped portions (peeled portions). This fact showed that these composites had sufficient heat cycle resistance.

On the other hand, the composites of the comparative examples had such a large number of cracks that the healthy rate thereof was reduced by 12% to 66%.

Furthermore, as is clear from the results shown in Table 3, in the ceramic-metal composites, including the active metal brazing alloy layers containing a predetermined amount of a Group-8 element that was a transition metal component such as Co or Pd, according to the examples, it was observed that the Group-8 element was diffused in also the metal circuit plates during heat bonding operation. This showed that the diffusion of the Group-8 element enhanced the wettability of the brazing alloy materials with respect to the metal plates so as to increase the bonding strength of the metal plates and therefore these ceramic-metal composites had high thermal cycle resistance.

In addition, it was also confirmed by means of microscopy that the Group-8 element was diffused in regions that were about 1-2 μm apart from bonding surfaces of the metal circuit plates.

Furthermore, it was also confirmed that an improvement in the bondability of the copper plates due to the presence of Co or Pd prevented the molten brazing alloys from being excessively expanded during the bonding operation and allowed the brazing alloys to be subjected to bonding with the initial shapes thereof maintained.

That is, for example, a pasty brazing alloy material containing no Co is formed into a circuit pattern by screen printing, the brazing alloy is melted during the bonding of such a rectangular copper plate (copper circuit plate) as shown in FIGS. 1 to 3 and therefore bleeds and extends between portions of the circuit pattern to cause the pattern to be short-circuited (shorted). Therefore, there was tendency that the brazing alloy layers had excessively etched portions, from which cracks originated due to heat cycles.

In contrast, for the brazing alloys containing Co or Pd used in the examples, the positions of printed patterns were capable of being maintained because the brazing alloys did not bleed and extend between the patterns. Therefore, the brazing alloy layers were capable of being formed so as to have no cracks due to thermal cycles and extending portions with a width of about 0.02 to 0.1 mm. This allowed the composites to have enhanced heat cycle resistance. The use of the ceramic-metal composites according to the examples allows semiconductor devices which hardly crack and which have high durability and reliability to be manufactured with a high production yield in a large scale.

INDUSTRIAL APPLICABILITY

According to a ceramic-metal composite and a method of manufacturing the ceramic-metal composite according to the present invention, an active metal brazing alloy layer contains a predetermined amount of a transition metal that is at least one element selected from Group-8 elements specified in the periodic table and the transition metal segregates in a metal plate during heat bonding operation because of the high reactivity of the transition metal with respect to a component of the metal plate; hence, a reaction product reducing the wettability (bondability) of the brazing alloy layer with respect to the metal plate is prevented from being excessively produced. This allows the brazing alloy layer and the metal plate to be maintained in good bonding condition.

In addition, a segregation layer of the transition metal restricts the width of a portion wet with a component of a molten brazing alloy; hence, the brazing alloy can be prevented from excessively expanding or bleeding, a metal circuit plate can be prevented from being short-circuited, the bonding strength between the metal plate and a ceramic substrate can be significantly enhanced, and the ceramic-metal composite can be enhanced in heat cycle resistance and durability. Accordingly, the use of the ceramic-metal composite as a circuit board allows semiconductor devices which hardly crack and which have high durability and reliability to be manufactured with a high production yield in a large scale.

The invention claimed is:

1. A ceramic-metal composite comprising:
   a ceramic substrate;
   an active metal brazing alloy layer containing Ag; Cu; at least one active metal selected from a group consisting of Ti and Zr; and a transition metal that is one of cobalt or palladium; and
   a metal plate comprising a copper plate bonded to the ceramic substrate through the active metal brazing alloy layer disposed therebetween,
   wherein the content of cobalt or palladium contained in the active metal brazing alloy layer is 0.02% to 0.5% by mass, and
   wherein the one of cobalt or palladium is dispersed in the copper plate.

2. The ceramic-metal composite according to claim 1, wherein the active metal is only Ti.

3. The ceramic-metal composite according to claim 1, wherein the active metal brazing alloy layer further contains at least one of Sn and In.

4. The ceramic-metal composite according to claim 1, wherein the active metal brazing alloy layer further contains carbon.

5. A semiconductor device comprising the ceramic-metal composite according to any one of claims 2 to 4 as a ceramic circuit board.

6. The ceramic-metal composite according to claim 1, wherein the ceramic substrate is silicon nitride substrate or aluminum nitride substrate.

7. The ceramic-metal composite according to claim 1, wherein bonding strength of the copper plate is 10.2 kN/m or more and 17.2 kN/m or less.

\* \* \* \* \*